United States Patent [19]
Guerra

[11] Patent Number: 4,703,183
[45] Date of Patent: Oct. 27, 1987

[54] ION IMPLANTATION CHAMBER PURIFICATION METHOD AND APPARATUS

[75] Inventor: Michael Guerra, Newburyport, Mass.

[73] Assignee: Eaton Corporation, Cleveland, Ohio

[21] Appl. No.: 805,952

[22] Filed: Dec. 5, 1985

[51] Int. Cl.⁴ .................................................. G21G 5/00
[52] U.S. Cl. ............................... 250/492.2; 250/492.3; 118/729
[58] Field of Search ............ 250/492.2, 492.21, 492.3; 118/725, 729, 50.1; 427/38, 50, 51, 444; 156/643

[56] References Cited

U.S. PATENT DOCUMENTS

| | | | |
|---|---|---|---|
| 4,138,306 | 2/1979 | Niwa | 156/345 |
| 4,234,797 | 11/1980 | Ryding | 250/492.2 |
| 4,419,584 | 12/1983 | Benveniste | 250/492.2 |
| 4,430,547 | 2/1984 | Yoneda et al. | 219/121 PD |
| 4,529,474 | 7/1985 | Fujiyama et al. | 156/643 |
| 4,567,938 | 2/1986 | Turner | 165/1 |
| 4,587,433 | 5/1986 | Farley | 250/492.2 |
| 4,608,063 | 8/1986 | Kurokawa | 55/208 |

Primary Examiner—Carolyn E. Fields
Assistant Examiner—Paul A. Guss
Attorney, Agent, or Firm—Watts, Hoffman, Fisher & Heinke Co.

[57] ABSTRACT

A process for computer-controlled cleaning of particulates from surfaces, in particular those of semiconductor wafers, which are in the volume of an ion-implantation chamber prior to the implantation of electrically active ions into the wafers. The process utilizes the wafer-holding disk, which carries the semiconductor wafers during implantation, to create a strong turbulence of gas within the end station volume of the ion implanter. This loosens particulates from interior surfaces of the end chamber. The airborne particulates are then evacuated from the chamber volume by a vacuum pump. A single sequence, consisting of air agitation followed by flushing and then filling, reduces the particulate count by an incremental amount; a series of such sequences results in the desired asymptotic reduction in particulate contamination.

9 Claims, 3 Drawing Figures

ION IMPLANTATION CHAMBER PURIFICATION METHOD AND APPARATUS

TECHNICAL FIELD

The present invention relates to ion implantation generally and more specifically to the control of particulate contamination in an ion implantation chamber.

BACKGROUND ART

The fabrication of semiconductor electronics and other micromanufactured devices is steadily evolving to smaller dimensions of the components and thus greater density of the microelements. As the dimensions of the components decrease to the one micrometer level and below, the problems of contamination during manufacturing become of increasing importance.

It has been recognized in the art that the fabrication of the devices must be carried out under rigid control of contaminants and particulates. Of special concern to the semiconductor industry which manufactures large scale integrated circuits is the control of the particulates during the process of implantation of electrically active ions into silicon wafers.

One implantation procedure now used during the processing of silicon wafers used for manufacturing semiconductor devices (including large scale integrated circuits) involves a number of steps, each of which may have a high potential for contaminating the wafer with particulates of the order of one micrometer. Among these steps are the transfer of the wafer into a vacuum chamber, spinning the wafer at high rotational speeds, bombarding the wafer with high currents of energetic ions, and removing the wafers from the chamber to a next processing stage. U.S. Pat. Nos. 4,234,797 to Ryding and 4,419,584 to Benveniste disclose prior art ion beam implantation systems particularly suited for doping semiconductor substrates and are expressly incorporated herein by reference. The present invention offers an automated way of keeping the level of particulates below the maximum allowed by the industry.

DISCLOSURE OF THE INVENTION

In accordance with the present invention particle contamination levels are reduced by a cleaning procedure that alternately raises and lowers the pressure in an ion implantation chamber as turbulence within the chamber dislodges contaminant particles. The dislodged particles are swept from the chamber each time the pressure is lowered and repeated cycling of the pressure lowers contaminent concentration.

In accordance with a preferred embodiment of the invention the turbulence is created by rotating a wafer support through the ion implantation chamber while the pressure is cycled. The pressure is lowered by a pump coupled to the chamber that is used to lower pressure inside the chamber during ion implantation. The pressure is raised by venting the chamber and allowing dried, filtered air to enter the chamber. As the disk support rotates through the air, a turbulence is created that dislodges particles from the walls of the chamber as well as from the wafer support. By lowering the pressure these dislodged particles are swept from the chamber. Repeated cycling of the pressure while the wafer support rotates in the chamber asymptotically lowers the contaminant level.

Practice of the invention yields maximum particulate levels which are the lowest so far achieved by commercial implanters. The cleaning procedure is rapid and repoducable. The process involves no manual steps. The cleaning procedure is completely controlled by a computer and each step of the full sequence can be changed according to experience and need. The cleaning procedure is controlled by the same computer used to control the ion implantation process itself and thus becomes one of the standard sequences used to process the wafers for commercial production.

The procedure has great flexibility: the time increments of each step in the sequence as well as the pressure in the chamber during each agitation-of-the-gas phase can be varied depending on experience and need.

A wafer inspection phase which monitors the particulate concentration may be utilized to give a positive indicator of when to start the implantation process. In one embodiment, the disk support is sculptured to make the turbulence cycle more effective.

From the above it should be appreciated that one object of the invention is a controlled reduction in contaminant levels in an ion implantation system for doping semiconductor wafers. This and other objects, advantages, and features of the invention will become better understood from the detailed description of a preferred embodiment of the invention.

BEST MODE FOR CARRYING OUT THE INVENTION

Figure 1:
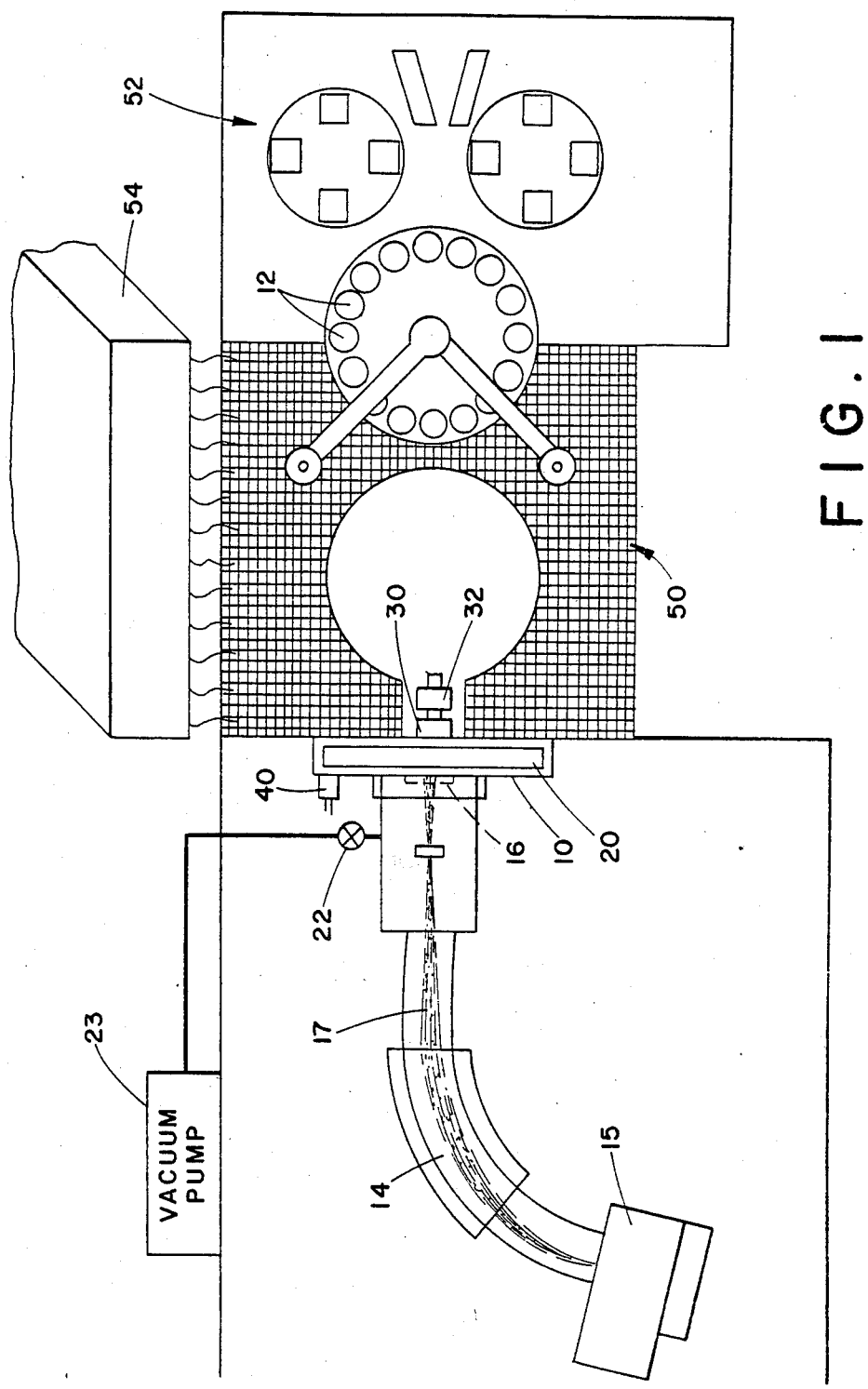
FIG. 1 is a schematic of the ion implantation station showing an ion beam, semiconductor wafers, wafer holder, wafer loader, and implantation chamber.
Figure 2:
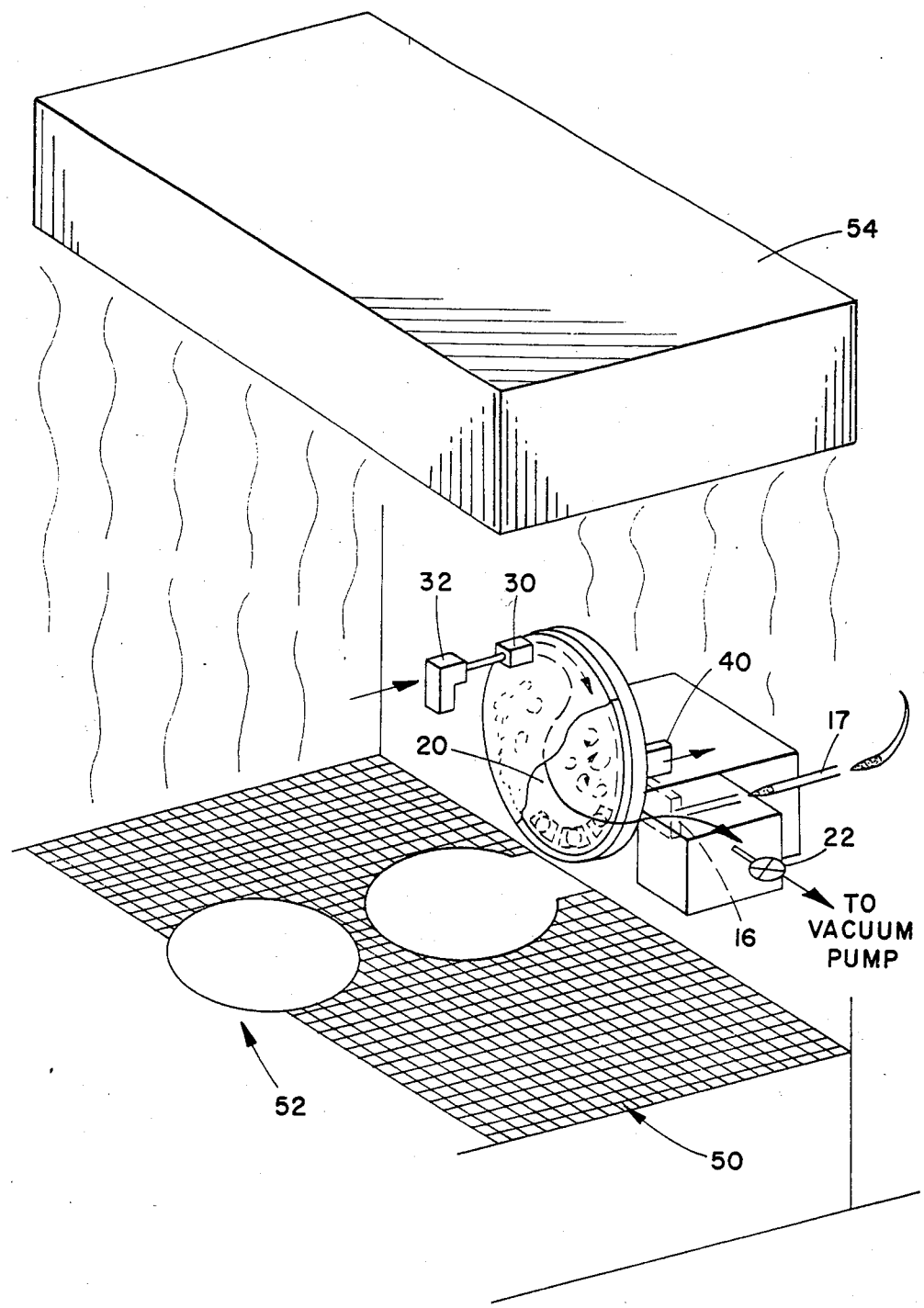
FIG. 2 is a schematic of the air and vacuum paths coupled to the implantation chamber.

Turning now to the drawings, FIG. 1 illustrates an ion target chamber 10 opened to the atmosphere in preparation for loading semiconductor wafers 12 for ion implantation. An ion source-accelerator 14 section of the implanter is under vacuum, separated by an isolation valve 16 from the volume of the target chamber 10. An ion source 15 directs a beam 17 of ions through this evacuated region to the chamber 10. A disc-shaped wafer support 20 is loaded with the wafers 12 and inserted into the chamber 10. The chamber 10 is evacuated through a vacuum valve 22 coupled to a vacuum pump 23 and the support 20 is brought up to speed, rotating the wafers 12 in front of the ion beam. The valve 22 is closed and the valve 16 is opened and a Faraday cage (not shown) is pulled out of the way so the ion beam is allowed into the chamber 10.

Implantation is carried out to a preset dose of ions per square centimeter, according to procedures well known in the art. The isolation valve 16 is closed, the rotating disc is stopped and a vent valve 30 is opened to let in filtered dry air and bring the chamber volume up to atmospheric pressure. The support 20 is removed from the chamber 10 and the implanted wafers 12 are taken from the support for further processing.

The cleaning procedure of the invention operates most effectively if vents and pumping ports coupled to the chamber 10 are positioned, as described above, for the most effective laminar flow of air when the chamber is filled or evacuated. Dummy wafers are loaded onto the support 20 and the support 20 is placed in position in the chamber 10. The chamber 10 is evacuated through the valve 22. The vent valve 30 is then opened to let in filtered dry air. A filter 32 minimizes the inclusion of airborn particulates. As the filtered dry air vents into the chamber 10, the valve 22 may be controlled to adjust the pressure in the chamber 10.

The support 20 is spun at high speed for a predetermined time T. The spinning support 20 agitates the air in the chamber 10 to create high turbulence which dislodges particulates from the support 20, and walls of the chamber 10. The vent valve 30 is then closed and the valve 22 is opened so as to evacuate the chamber. The steps of venting and evacuating the chamber 10 are alternated while the support 20 is spun. The number of alternations (or sequences) can be programmed by the operator. The support rotation is halted and one final venting and evacuation sequence performed. Following the full sequence of cleaning steps, the chamber 10 volume is opened and a disc of wafers is then loaded for implantation.

A gridded table top 50 is positioned beneath a travel path from a wafer loading station 52 to the ion implantation station where the wafer support 20 is tilted up to a vertical orientation within the chamber 10. The table top 50 allows air flow in the region of the wafers during loading and unloading to remain laminar to a point below the lowest position that the wafers occupy. An electrostatic filter 54 directly above the table top 50 also cleans the air to assure as few contaminants as possible are picked up during transportation of wafers to and from the chamber 10.

The pressure in the target chamber 10 can be controlled during the air agitation phase above by controlling the air input pressure through a programmable regulator 40 and the degree of openness of the venting valve 30 and the vacuum valve 22. In practice it has been found that a pressure of 25 to 100 torr in the venting stage produces excellent results, but higher pressures are also effective and a cycle of cleaning runs covering a range of pressure values appears to have merit.

The sequence of steps, the duration of each part of the sequence and the pressure values used can all be preprogrammed according to the state of the art, and thus made automatic and reproducible without need for operator expertise.

Figure 3:
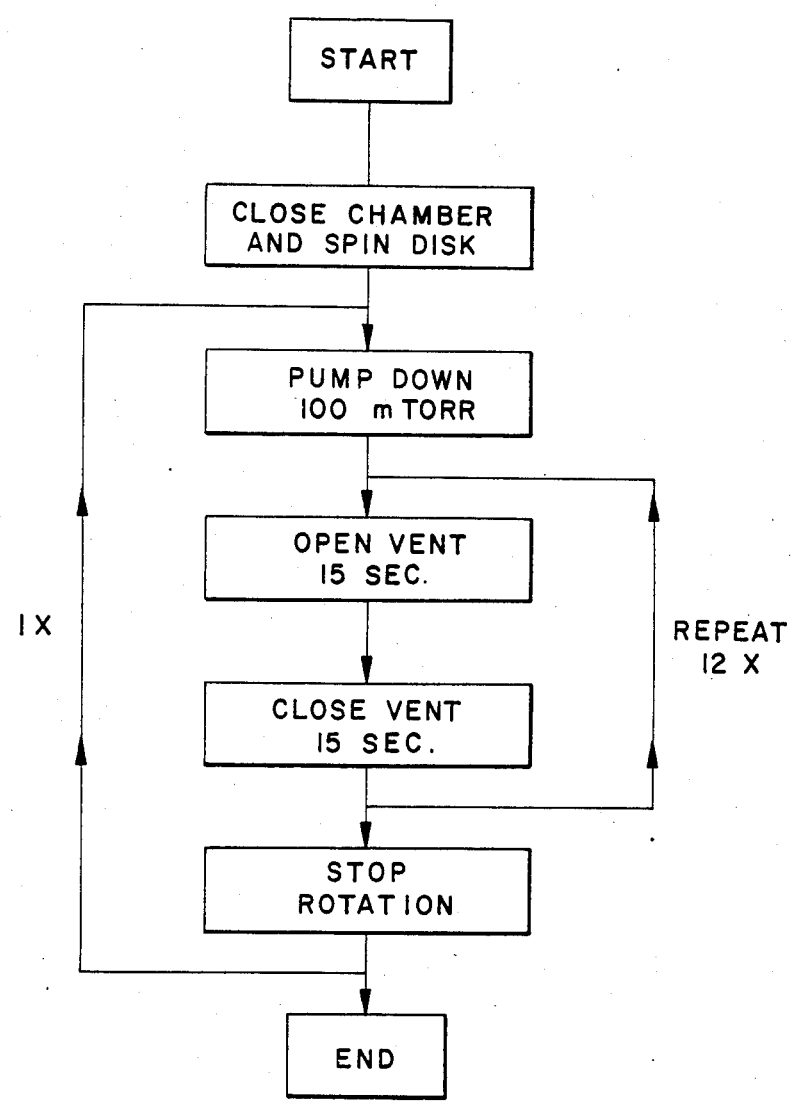
FIG. 3 is a flow diagram of a chamber cleaning procedure.

FIG. 3 shows one cleaning sequence which has been used with considerable success, reducing the count of particles greater than 1 micrometer to below 1 particle per cm$^2$. A computer algorithm is initiated with the closing of the end station chamber 10 while the isolation valve 16 is open and the implantation station is under vacuum from the pump. The support 20 is spun and a 12 cycle pattern of vent open followed by vent closed is carried out. In the algorithm shown in FIG. 3, the vent is kept open for 15 seconds allowing the pressure to reach 100 torr and then closed for 15 seconds, allowing the chamber 10 to be evacuated to about 0.01 torr. After the 12 cycles, the disc rotation is stopped and the 12 cycle pattern is repeated.

The precise period for the sequence of events described above is not critical. Variations appear to be equally effective. For example, the venting phase may be done with the vacuum valve 22 completely closed; the angular speed of the disc may be changed, several vent and evacuation ports positioned about the chamber 10 can be used; these vents and vacuum ports can be positioned and operated in such a sequence as to most effectively scour the volume of the chamber 10.

The described position of the vacuum pump valve and vent valve are not critical. Other designs may be equally effective. For example, a separate vacuum valve 22 may be added directly to the chamber volume so that the vacuum-vent cycles can be isolated from the accelerator volume. In that way, the accelerator volume can always be under high vacuum, while the evacuation-vent cycle can have pressure excursions from high vacuum to greater than atmospheric pressure if needed.

From the above it is apparent that while a preferred embodiment of the invention has been described with a degree of particularity, it is the intent that the invention include all modifications and alterations from the disclosed design falling within the spirit or scope of the appended claims.

I claim:

1. Apparatus for ion implantation of semiconductor wafers comprising:
   an ion implantation enclosure;
   ion source means for directing a beam of ions into the ion implantation enclosure;
   rotatably mounted wafer support means for moving wafers from a position outside the enclosure where wafers are loaded onto the support means to a position inside the enclosure where said wafers are rotated through the ion beam;
   first valve means for coupling the enclosure to a pump for lowering the pressure in the enclosure;
   second valve means for routing a fluid inside the enclosure;
   drive means for rotating the wafer support means within the enclosure; and
   control means to alternately open and close the first and second valve means while actuating the drive means to dislodge particle contaminants inside the enclosure and remove them from said enclosure.

2. The apparatus of claim 1 additionally comprising filter means for filtering particles in the fluid entering the enclosure through the second valve means.

3. The apparatus of claim 1 where the control means comprises a computer programmed to open and close the valve means for predetermined time periods.

4. A method for reducing particulate contamination inside an ion implantation chamber to prepare the ion implantation chamber for treatment of one or more wafers as the one or more wafers are rotated through an ion implantation beam on a rotatable wafer support; said method comprising the steps of
   rotating said wafer support inside the chamber before one or more wafers are placed on the support to create a turbulence of air within the ion implantation chamber; and
   while the wafer support is rotated inside the chamber alternately venting the chamber to allow air to enter the chamber and evacuating air and dislodged particle contaminates from the chamber interior.

5. The method of claim 4 further comprising the step of filtering the air entering the chamber before it enters the chamber.

6. A method for ion implantation of one or more target wafers supported within an ion implantation chamber comprising the steps of:
   reducing an impurity level within the implantation chamber by rotating a target wafer support within the ion implantation chamber to create a turbulence while alternately venting the chamber to allow air to enter the chamber and removing contaminants dislodged by the turbulence from the chamber by evacuating air and contaminants from the chamber through a chamber exit;

controlling air pressures within the chamber during the venting and evacuating of the implantation chamber;

transporting wafers to the implantation chamber along a wafer travel path;

filtering air that contacts the wafers as they are transported along the travel path;

placing the wafers in the chamber and evacuating the chamber; and directing a beam of ions to impact the wafers and inject a controlled dose of ions into the wafers.

7. The method of claim 6 wherein the controlling step is performed by opening and closing a vent port and an evacuation port in controlled amounts for predetermined time periods.

8. The method of claim 7 wherein the rotation of the target wafer support is stopped at least once and then again started during the reducing step.

9. The apparatus of claim 1 additionally comprising means to filter air which contacts the wafers as said wafers are moved from the position outside the chamber where the wafers are loaded onto the support to the position inside the chamber where the wafers are rotated through the ion beam.

* * * * *